United States Patent [19]

Kemper et al.

[11] 4,123,680
[45] Oct. 31, 1978

[54] PIEZOELECTRIC QUARTZ CRYSTAL PRODUCTS AND FABRICATION METHODS THEREFOR

[75] Inventors: Daryl M. Kemper; Louis A. Dick, both of Litchfield Park, Ariz.

[73] Assignee: Tyco Crystal Products, Inc., Phoenix, Ariz.

[21] Appl. No.: 800,725

[22] Filed: May 26, 1977

[51] Int. Cl.² .............................................. H01L 41/10
[52] U.S. Cl. .................................... 310/320; 310/353; 310/365; 310/366; 310/367; 333/72
[58] Field of Search .................................. 310/365–369, 310/312, 320, 351, 353; 333/72

[56] References Cited

U.S. PATENT DOCUMENTS

| | | | |
|---|---|---|---|
| 2,635,199 | 4/1953 | Wolfskill | 310/366 |
| 3,336,487 | 8/1967 | Martyn et al. | 310/365 X |
| 3,582,836 | 6/1971 | Kent | 310/312 X |
| 3,638,146 | 1/1972 | Takaku | 310/366 X |
| 3,924,259 | 12/1975 | Butler | 310/367 X |
| 3,970,880 | 7/1976 | Deutschmann et al. | 310/366 X |

Primary Examiner—Mark O. Budd
Attorney, Agent, or Firm—Harry Max Weiss

[57] ABSTRACT

This disclosure relates to improved piezoelectric quartz crystal products preferably used in quartz crystal filter and resonator applications, and fabrication methods therefor. Various embodiments are disclosed including a substantially circular, a square, and a rectangular quartz crystal product wherein each one contains a single triangular shaped electrode located on each of the two sides thereof in an overlapping arrangement. Other embodiments disclosed include a substantially circular, a square, and a rectangular quartz crystal product wherein each one contains multiple electrodes such as two spaced apart triangular shaped electrodes located on each side of the two sides thereof in an overlapping arrangement. Another disclosed embodiment is a substantially pie shaped (preferably quarter pie shaped) quartz crystal product which has either a single, substantially pie shaped, electrode located on each side of the two sides thereof in an overlapping configuration or a pair of spaced apart substantially pie shaped electrodes located on each side of the two sides thereof in an overlapping configuration. A method is also disclosed for fabricating the substantially pie shaped quartz crystal product of this invention.

27 Claims, 25 Drawing Figures

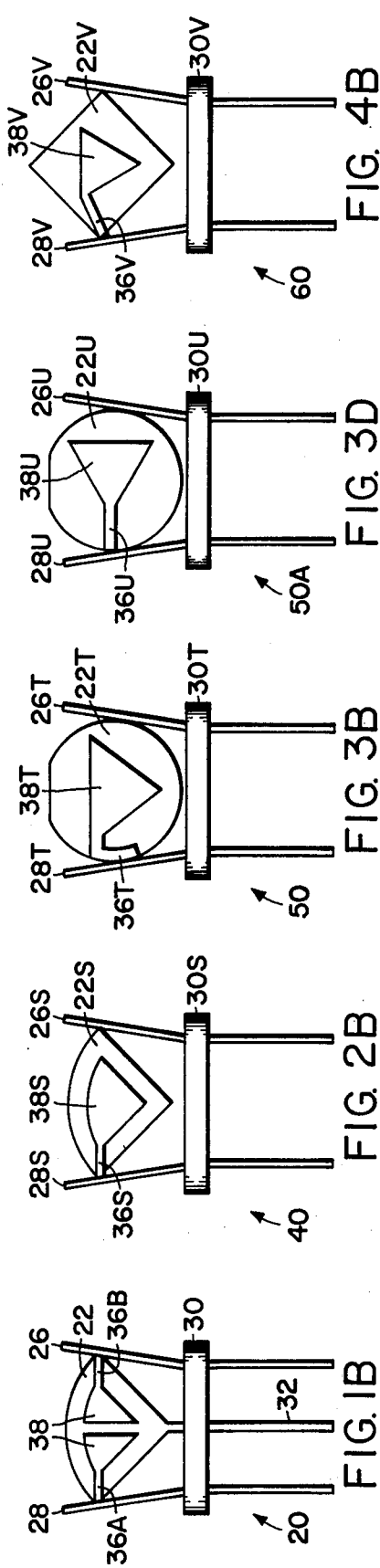

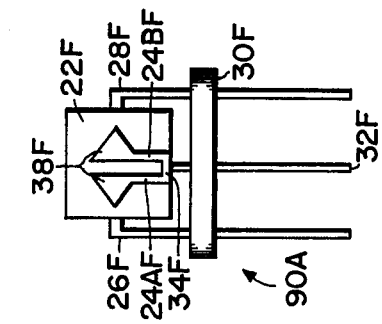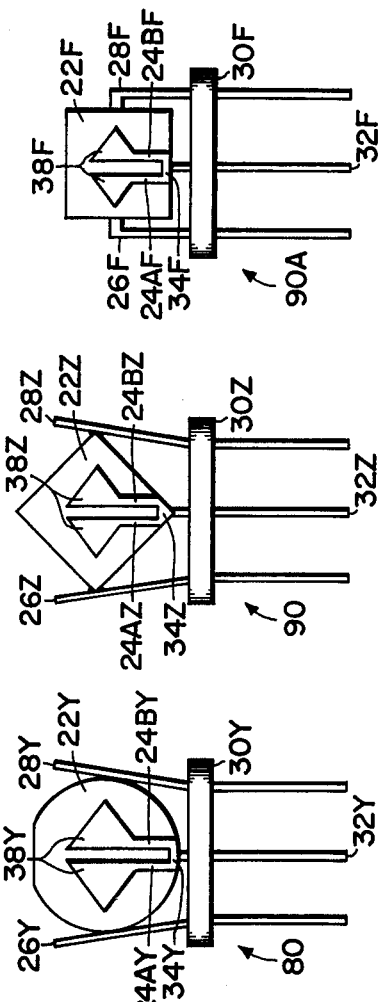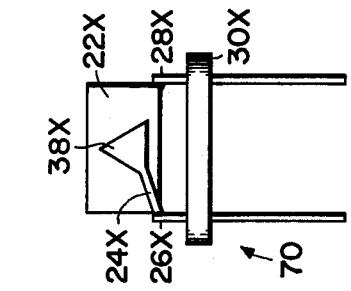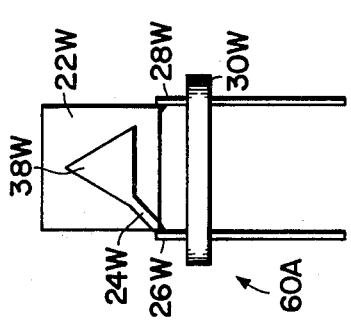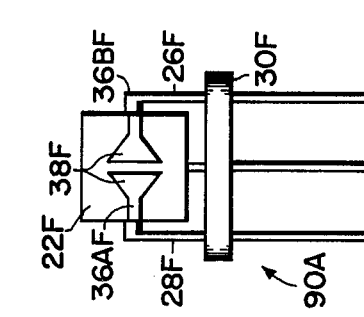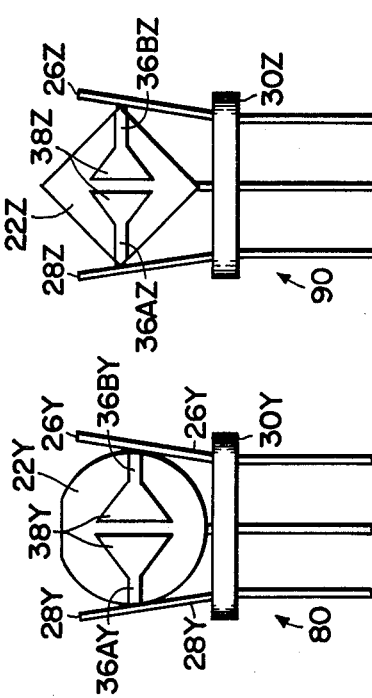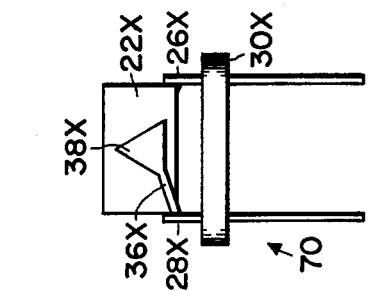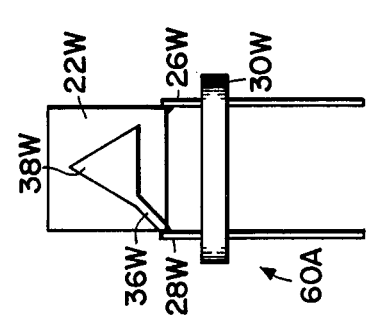

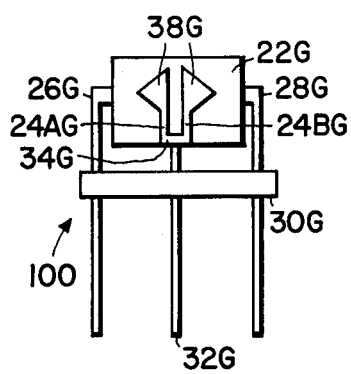
FIG. 8A
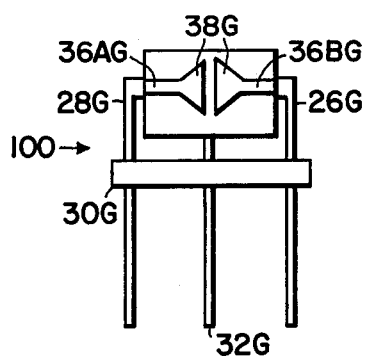
FIG. 8B
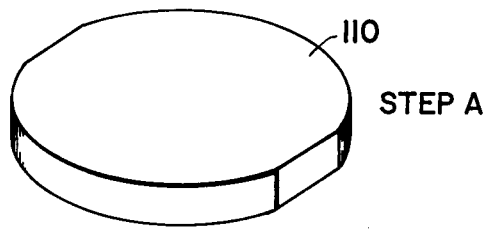
STEP A
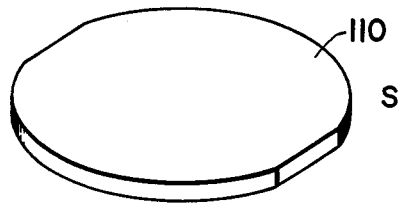
STEP B
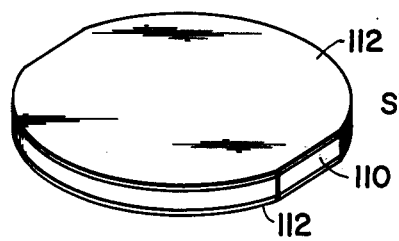
STEP C
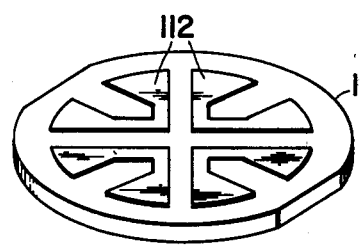
STEP D (FRONT)
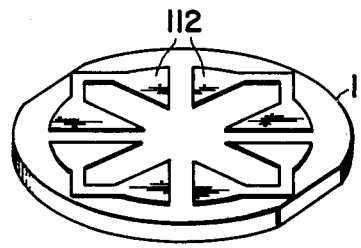
STEP D (BACK)
FIG. 9
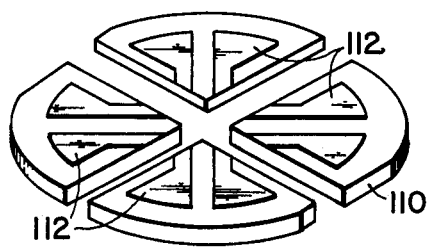
STEP E

PIEZOELECTRIC QUARTZ CRYSTAL PRODUCTS AND FABRICATION METHODS THEREFOR

BACKGROUND OF THE INVENTION

1. Field of the Invention

This invention relates generally to piezoelectric units and fabrication methods thereof and, more particularly, to piezoelectric quartz crystal units such as filters having improved electrode configurations or improved piezoelectric quartz crystal substrates or combinations of both including fabrication methods therefor.

2. Description of the Prior Art

The radio frequency spectrum is very broad and ranges from about 15 K hz (15,000 cycles per second) to at least about 200,000 M hz (200,000,000,000 cycles per second). Accordingly, it is extremely critical over this entire range of frequencies that a quartz crystal unit be accurate in order to permit transmission and/or reception of the desired frequency signal. This has become especially important in the present environment due to the crowding and closer spacings between assigned frequencies in the available radio frequency spectrum. Thus, in order to attain the goal of having electronic equipment operate with maximum efficiency and accuracy to permit optimum utilization of the limited available radio frequency spectrum, the highest possible precision and stability is required for the transmitted frequency and maximum selectivity is necessary at the receiver.

Although single side band and suppressed carrier communication systems permit the use of more communication channels in a given frequency band, this only serves to place greater emphasis and need for frequency stability and control of both the transmitter and receiver electronic equipment containing quartz crystal units. Many electronic systems including sophisticated equipment used in government or military applications, navigation and ranging systems, etc., depend upon precise frequency control and very accurate time measurements. Thus, the required frequency control and stability needed in trasmitter/receiver systems depends a great deal upon the accuracy and precision of the quartz crystal units which are used as passive elements in oscillator circuits and in electrical wave filters.

Additionally, very high precision and accuracy is also required of quartz crystal units that are used in time keeping applications, devices or systems where equal intervals of time must be precisely marked off. Other applications, for example, where precision type quartz crystal units are used are in digital thermometers, pressure indicators, accelerometers, etc.

The inharmonic modes generated or excited by a piezoelectric quartz crystal unit are known as the "spurs" (spurious modes) whose frequencies generally lie in a relatively narrow range immediately above the main or harmonic mode. In the design and use of piezoelectric quartz crystal units for oscillator applications, these spurious modes that are excited by the driving source are of less concern than in filter applications.

These inharmonic or spurious modes are, however, a serious problem for piezoelectric quartz crystal high frequency filter applications and a need existed to develop improved piezoelectric quartz crystal under which would significantly minimize the effect of these inharmonic modes. Therefore, by reducing or attenuating these spurious modes, the quartz crystal unit can be excited (through the piezoelectric effect) to vibrate at one of its specified resonance modes with improved attenuation of spurious modes.

In the past, manufacturers of piezoelectric quartz crystals generally fabricated either single electrodes per substrate surface or multiple electrodes per substrate surface using square, rectangular, or substantially circular shaped piezoelectric quartz crystal substrates. These prior art types of piezoelectric quartz crystal units utilized electrodes that were either of a generally square, rectangular, or a circular shaped configuration. For example, prior art showing of a substantially square shaped electrode configuration used for circular type piezoelectric quartz crystal units is shown in U.S. Pat. No. 3,564,463 (See FIG. 1).

An example of a prior art piezoelectric quartz crystal unit which utilized a substantially circular shaped quartz crystal substrate and electrodes that had a substantially circular geometry is shown in U.S. Pat. No. 3,396,327. These prior art piezoelectric quartz crystal units with their generally square, rectangular or circular shaped electrodes were only marginal for suppressing or attenuating the spurious modes or inharmonic overtones in many applications.

U.S. Pat. No. 3,582,866 depicts a monolithic type quartz crystal filter which utilizes four resonators (four pie shaped electrodes) on a circular substrate (see FIG. 3). Two of these resonators, namely 43 and 46, provide the respective input and output resonators. Thus, a single four-pole filter unit is shown by this prior art reference with each of the pie shaped electrodes located in one quadrent of the circular substrate. There is no suggestion as to the use of a single or double pie shaped electrode per substrate surface which would be located and arranged to provide significant attenuation of spurious modes. The only substrates disclosed by this reference are rectangular and circular substrates.

U.S. Pat. No. 3,638,146 discloses a piezoelectric ceramic filter which uses a pair of electrodes on a substrate surface and a single electrode on the back substrate surface. The pair of electrodes is configured as two parts of a semi-circle having a relatively straight side across both parts. For this ceramic type of piezoelectric device using a rectangular substrate and this type of split electrode, an improvement in attenuation of spurious modes was apparently achieved. However, use of this type of electrode arrangement (three electrodes per unit and the configuration of the electrodes) has not been adopted or extensively used by the quartz device manufacturers.

Presently, high quality piezoelectric quartz crystal units are mainly man made due to the difficulty in locating large sources of natural quartz crystals. However, in both instances, the cost of producing very good quality piezoelectric quartz crystal substrates to be used to make quartz crystal units with rigorous spurious attenuation specifications can be very high.

The major cost disadvantage associated with prior art piezoelectric quartz crystal units is that they utilize a great deal of valuable and expensive piezoelectric quartz crystal material. Generally, the prior art piezoelectric quartz crystal units utilize either an entire substantially circular piezoelectric quartz crystal substrate or an entire square shaped or rectangular shaped piezoelectric quartz crystal substrate to provide an individual piezoelectric quartz crystal unit. With the definite need to both reduce costs and to increase the producability of piezoelectric quartz crystal units with rigorous spurious attenuation specifications, it became extremely important to develop piezoelectric quartz crystal products that would utilize less piezoelectric quartz crystal substrate material and yet perform significantly better in operation within various electronic apparatus.

Accordingly, a need existed to provide improved piezoelectric quartz crystal units that (a) would have high electrical parameters when used in various applications, (b) further improve the attenuation or suppression of inharmonic modes, and (c) would be relatively inexpensive to fabricate.

SUMMARY OF THE INVENTION

Accordingly, it is an object of this invention to provide an improved piezoelectric quartz crystal unit.

It is another object of this invention to provide an improved piezoelectric quartz crystal unit which has improved electrode configurations.

It is still another object of this invention to provide an improved piezoelectric quartz crystal unit which has an improved single electrode on each side of the unit.

It is a further object of this invention to provide an improved piezoelectric quartz crystal unit which has improved two or more electrodes on each side of the unit.

It is still another object of this invention to provide a method for fabricating multiple piezoelectric quartz crystal units from a single piezoelectric quartz crystal substrate.

BRIEF DESCRIPTION OF THE DRAWING

FIG. 1A shows one side of a quarter pie shaped piezoelectric quartz crystal device in accordance with one embodiment of this invention depicting a pair of electrodes per surface having pie shaped geometries.

FIG. 1B shows the other side of the quarter pie shaped piezoelectric quartz crystal device of FIG. 1A.

FIG. 2A shows one side of a quarter pie shaped piezoelectric quartz crystal device in accordance with another embodiment of this invention depicting a single electrode per surface having pie shaped geometry.

FIG. 2B shows the other side of the quarter pie shaped piezoelectric quartz crystal device of FIG. 2A.

FIG. 3A shows one side of a substantially circular shaped piezoelectric quartz crystal device in accordance with another embodiment of this invention depicting a single electrode per surface having a triangular shaped geometry.

FIG. 3B shows the other side of the substantially circular shaped piezoelectric quartz crystal device of FIG. 3A.

FIG. 3C shows one side of a substantially circular shaped piezoelectric quartz crystal device in accordance with still another embodiment of this invention depicting a single electrode per surface having a triangular shaped geometry different than the triangular shaped geometry of the electrode of FIG. 3A or 3B.

FIG. 3D shows the other side of the device of FIG. 3C.

FIG. 4A shows one side of a square shaped piezoelectric quartz crystal device in accordance with another embodiment of this invention depicting a single electrode per surface having a triangular shaped geometry.

FIG. 4B shows the other side of the square shaped piezoelectric quartz crystal device of FIG. 4A.

FIG. 4C shows one side of a square shaped piezoelectric quartz crystal device in accordance with still another embodiment of this invention similar to the device of FIG. 4A, but having the substrate turned and the triangular electrode also turned.

FIG. 4D shows the other side of the device of FIG. 4C.

FIG. 5A shows one side of a rectangular shaped piezoelectric quartz crystal device in accordance with another embodiment of this invention depicting a single electrode per surface having a triangular shaped geometry.

FIG. 5B shows the other side of the rectangular shaped piezoelectric quartz crystal device of FIG. 5A.

FIG. 6A shows one side of a substantially circular shaped piezoelectric quartz crystal device in accordance with another embodiment of this invention depicting two electrodes per surface with each electrode having a triangular shaped geometry.

FIG. 6B shows the other side of the substantially circular shaped piezoelectric quartz crystal device of FIG. 6A.

FIG. 7A shows one side of a square shaped piezoelectric quartz crystal device in accordance with another embodiment of this invention depicting a pair of electrodes per surface with each electrode having a triangular shaped geometry.

FIG. 7B shows the other side of the square shaped piezoelectric quartz crystal device of FIG. 7A.

FIG. 7C shows one side of a square shaped piezoelectric quartz crystal device in accordance with still another embodiment of this invention similar to the device of FIG. 7A, but having the substrate turned.

FIG. 7D shows the other side of the square shaped piezoelectric quartz crystal device of FIG. 7C.

FIG. 8A shows one side of a rectangular shaped piezoelectric quartz crystal device in accordance with another embodiment of this invention depicting a pair of electrodes per surface with each electrode having a triangular shaped geometry.

FIG. 8B shows the other side of the rectangular shaped double electrode piezoelectric quartz crystal device of FIG. 8A.

FIG. 9 shows Steps A through E which are perspective views of the sequence of Steps in the process of making four identical pie shaped piezoelectric quartz crystal substrates from a single substrate (one of the four substrates is used in the device shown in FIGS. 1A, 1B).

DESCRIPTION OF THE PREFERRED EMBODIMENTS

Figure 10:
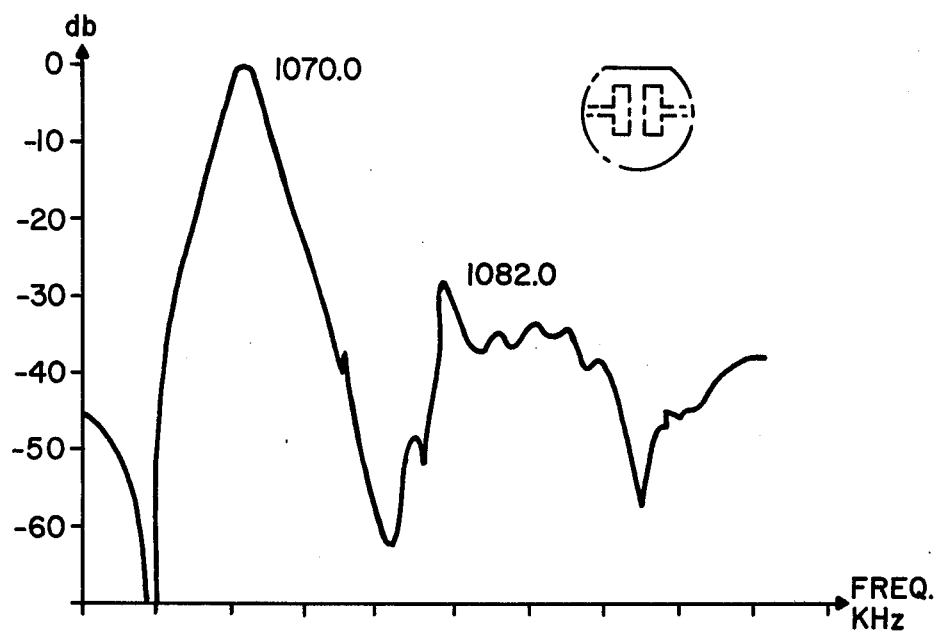
FIG. 10 is a graphical view of the electrical response curve that is achieved of a device using a substantially circular piezoelectric substrate having a pair of rectangular shaped electrodes wherein the abscissa is the frequency (in K H$_z$) and the ordinate is the db deviation value.

In accordance with one embodiment of this invention, a piezoelectric device is disclosed which comprises a pie shaped piezoelectric substrate. At least two electrically conductive support members are connected to the pie shaped piezoelectric substrate. At least one pie shaped electrode is located on each surface of the pie shaped piezoelectric substrate. For single electrode per surface types of piezoelectric devices, one pie shaped electrode is located on each surface (two surfaces per substrate) of the pie shaped piezoelectric substrate, however, for double electrodes per surface types of piezoelectric devices a pair of pie shaped electrodes is located on each surface of the pie shaped piezoelectric substrate. In the case of double electrodes per surface types of piezoelectric devices, three electrically conductive support members are connected to the pie shaped piezoelectric substrate. The one pie shaped electrode located on one surface of the pie shaped piezoelectric substrate of a single electrode per surface type piezoelectric device is electrically connected to one of the two electrically conductive support members while the one pie shaped electrode located on the other surface of the pie shaped piezoelectric substrate is electrically connected to the other of the two electrically conductive support members. The one pie shaped electrode located on one surface of the pie shaped piezoelectric substrate overlaps and is in registry with the one pie shaped electrode located on the other surface of the pie shaped piezoelectric substrate.

In accordance with another embodiment of this invention, a piezoelectric device is disclosed which comprises a piezoelectric substrate. At least two electrically conductive support members are connected to the piezoelectric substrate. Means are provided for improving the attenuation of spurious modes of the device. These means comprise at least one triangular shaped electrode located on each surface of the piezoelectric substrate. The triangular shaped electrode on one surface of the piezoelectric substrate is electrically connected to one of the two electrically conductive support members. The one triangular shaped electrode located on the other surface of the piezoelectric substrate is electrically connected to the other of the two electrically conductive support members. The one triangular shaped electrode located on one surface of the piezoelectric substrate overlaps and is in registry with the one triangular shaped electrode located on the other surface of the piezoelectric substrate.

In accordance with still another embodiment of this invention, a piezoelectric quartz crystal device is disclosed which comprises a piezoelectric quartz crystal substrate. At least two electrically conductive support members are connected to the piezoelectric quartz crystal substrate. Means are provided for improving the attenuation of spurious modes of the devices. These means comprise at least one pie shaped electrode located on each surface of the piezoelectric quartz crystal substrate. The one pie shaped electrode located on one surface of the piezoelectric quartz crystal substrate is electrically connected to one of the two electrically conductive support members. The one pie shaped electrode located on the other surface of the piezoelectric quartz crystal substrate is electrically connected to the other of the two electrically conductive support members. The one pie shaped electrode located on one surface of the piezoelectric quartz crystal substrate overlaps and is in registry with the one pie shaped electrode located on the other surface of the piezoelectric quartz crystal substrate.

In accordance with a further embodiment of this invention, a method is disclosed for fabricating a plurality of piezoelectric devices, preferably having substrates of a pie shaped configuration, from a single piezoelectric substrate preferably having a substantially circular geometry. The steps include the formation of a metal pattern of a desired configuration on the single piezoelectric substrate. The single piezoelectric substrate is cut with a plurality of pieces with each piece having a portion of the metal pattern located thereon to provide at least one electrode per surface for each piece.

The foregoing and other objects, features, and advantages of the invention will be apparent from the following, more particular description of the preferred embodiments of the invention, as illustrated in the accompanying drawings.

Referring to FIG. 1A, reference numeral 20 generally depicts the (double electrode per surface) piezoelectric quartz crystal device shown in this Figure. The device 20 comprises a substantially pie shaped piezoelectric quartz crystal substrate 22 having a pair of electrodes 24A and 24B in contact with one surface of the substrate 22. A first electrically conductive mounting support member 26 is mechanically connected to one side portion of the substrate 22 and a second electrically conductive mounting support member 28 is mechanically connected to the other side portion of the substrate 22. Each of these members extends through a header member 30 which is preferably made of an outer metal portion and an insulating glass type inner portion for providing both support and electrical isolation for the support members extending therethrough. A center electrically conductive mounting support member 32 extends through the insulation of the header member 30 and is electrically and mechanically connected to a metal base portion 34 located on the bottommost portion of the substrate 22 and is the termination member of the pair of electrodes 24A and 24B.

Referring to FIG. 1B, which is the back or other side portion of the device 20 of FIG. 1A, another pair of electrodes 36A and 36B are located on the back side of the substrate 22. The electrode 36A is a metalized layer that is electrically connected to the member 28 while the electrode 36B is electrically connected to the member 26. The electrodes 24A and 24B of FIG. 1A and the electrodes 36A and 36B of FIG. 1B each have extension portions having substantially pie shaped metalized geometries 38 which have an outer configuration portion that matches the contour of the substrate 22. The location of the substantially pie shaped metalized geometries 38 is such that each one of the two located on one side of the substrate 22 is in overlapping registry with one of the two located on the other side of the substrate 22.

Referring to FIG. 2A, another embodiment is shown of a quarter pie shaped piezoelectric quartz crystal device 40 having a single pie shaped electrode geometry per surface. The reference numerals in FIG. 2A that correspond to the reference numerals of FIG. 1A or 1B are used again to identify similar elements of the device 40, but the letter S is added to the corresponding reference numeral for FIG. 2A (or 2B). Thus, a single pie shaped electrode portion 38S is an extension of electrode 24S which is electrically connected to support member 26S. Referring to FIG. 2B, the single pie shaped electrode portion 38S is an extension of electrode 36S which is electrically connected to support member 28S. The pie shaped electrode portion 38S on one side of the substrate 22S is in overlapping registry with the corresponding pie shaped electrode portion 38S on the other side of the substrate 22S.

Both the device 20 of FIGS. 1A (1B) and the device 40 of FIGS. 2A (2B) used as a filter has shown a very significant advantage over prior art types of piezoelectric quartz crystal devices. For example, a 10db increase in attenuation of spurious or inharmonic modes was realized using the devices 20 and 40 of FIGS. 1A and 2A, respectively over other devices using rectangular, square or circular shaped electrode geometries and non-pie shaped substrates. The significant attenuation (of spurious modes) advantage of this device of FIG. 1A (or 1B) as compared to prior art devices is shown graphically in FIG. 11 in comparison with FIG. 10.

Referring to FIG. 3A, a substantially circular shaped, single electrode per surface, piezoelectric quartz crystal device 50 is shown which is similar to the device 40 to FIG. 2A, but has a triangular shaped electrode portion 38T and a different (substantially circular rather than pie shaped) substrate configuration. The reference numerals of FIGS. 1A and 1B are used again to identify similar elements of the device 50, but the letter T is added to the corresponding reference numeral for FIG. 3A (or 3B). The triangular shaped electrode portion 38T on one side of the device 50 (FIG. 3A) has an overlapping portion in registry with a similar portion of the triangular shaped electrode portion 38T located on the other side of the device 50 (FIG. 3B).

Referring to FIG. 3C, a substantially circular shaped, single triangular shaped electrode per surface, peizoelectric quartz crystal device 50A is shown which is similar to the device 50 of FIG. 3A, but has a different triangular shaped electrode geometry or configuration portion 38U on a substantially circular type substrate. The letter U is added to the corresponding reference numerals of FIG. 3C (or 3D) of the reference numerals used in FIG. 1A or 1B. The triangular shaped electrode 38U on one side of the device 50A (FIG. 3C) has an overlapping portion in registry with a similar portion of the triangular shaped electrode portion 38U located on the other side of the device 50A (FIG. 3D).

Referring to FIG. 4A, a square shaped, single electrode per surface, piezoelectric quartz crystal device 60 is shown which is somewhat similar to the device of FIG. 3A, but has a square shaped piezoelectric quartz crystal substrate 22V, mounted on a diagonal at two of the corners of the substrate 22V. The reference numerals in FIG. 4A that correspond to the reference numerals of FIG. 1A or 1B are used again to identify similar elements of the device 60, but the letter V is added to the corresponding reference numeral for FIG. 4A (or 4B). The triangular shaped electrode portion 38V located on one side of the device 60 (FIG. 4A) has an overlapping portion in registry with a similar portion of the triangular shaped electrode portion 38V located on the other side of the device 60 (FIG. 4B).

Referring to FIG. 4C, a square shaped, single triangular shaped electrode per surface, piezoelectric quartz crystal device 60A is shown which is somewhat similar to the device of FIG. 4A, but has a square shaped piezoelectric quartz crystal substrate 22W mounted differently in the device 60A (the bottom two corners of the substrate 22W are connected to support members 26W and 28W). The reference numerals in FIG. 4C that correspond to the reference numerals of FIG. 1A or 1B are used again to identify similar elements of the device 60A, but the letter W is added to the corresponding reference numeral for FIG. 4C (or 4D). The triangular shaped electrode 38W of FIG. 4C or 4D has a different arrangement on the square substrate 22W from the triangular shaped electrode 38V of FIG. 4A or 4B, but the triangular shaped electrode portion 38W located on one side of the device 60A (FIG. 4C) has an overlapping portion in registry with the triangular shaped electrode portion 38W located on the other side of the device 60A (FIG. 4D).

Referring to FIG. 5A, a rectangular shaped, single electrode per surface, piezoelectric quartz crystal device 70 is shown which is somewhat similar to the device shown in FIG. 4C, but has a rectangular shaped piezoelectric quartz crystal substrate 22X. The reference numerals in FIG. 5A that correspond to the reference numerals of FIG. 1A or 1B are used again to identify similar elements of the device 70, but the letter X is added to the corresponding reference numeral for FIG. 5A (or 5B). The triangular shaped electrode portion 38X located on one side of the device 70 (FIG. 5A) has an overlapping portion in registry with a similar portion of the triangular shaped electrode portion 38X located on the other side of the device 70 (FIG. 5B).

Referring to FIG. 6A, a substantially circular shaped, double electrode per surface, piezoelectric quartz crystal device 80 is shown which is somewhat similar to the device shown in FIG. 1A (or 1B), but has a substantially circular substrate 22Y and different (triangular shaped) electrode configurations. The reference numerals in FIG. 6A that correspond to the reference numerals of FIG. 1A or 1B are used again to identify similar elements of the device 80, but the letter Y is added to the corresponding reference numeral for FIG. 6A (or 6B). Each one of the pair of triangular shaped electrodes 38Y located on one side of the device 80 (FIG. 6A) has an overlapping portion in registry with a corresponding triangular shaped electrode 38Y located on the other side of the device 80 (FIG. 6B).

Referring to FIG. 7A, a substantially square shaped double electrode per surface, piezoelectric quartz crystal device 90 is shown which is somewhat similar to the device shown in FIG. 6A or 6B, but has a square shaped substrate 22Z mounted on the device 90 like the substrate 22V shown in FIG. 4A or 4B. The reference numerals in FIG. 7A that correspond to the reference numerals of FIG. 1A or 1B are used again to identify similar elements of the device 90, but the letter Z is added to the corresponding reference numeral for FIG. 7A (or 7B). Each one of the pair of triangular shaped elelctrodes 38Z located on one side of the device 90 (FIG. 7A) has an overlapping portion in registry with a corresponding triangular shaped electrode 38Z located on the other side of the device 90 (FIG. 7B).

Referring to FIG. 7C, a substantially square shaped, double electrode per surface, piezoelectric quartz crystal device 90A is shown which is somewhat similar to the device shown in FIG. 7A or 7B, but has its square shaped substrate 22F mounted on the device 90A somewhat like the substrate 22W of FIG. 4C (but is not connected at the bottom corners thereof). The reference numerals in FIG. 7A correspond to the reference numerals of FIG. 1A or 1B, but the letter F is added to the corresponding reference numeral for FIG. 7C (or 7D). Each one of the pair of triangular shaped electrodes 38F located on one side of the device 90A (FIG. 7C) has an overlapping portion in registry with a corresponding triangular shaped electrode 38F located on the other side of the device 90A (FIG. 7D).

Referring to FIG. 8A, a substantially rectangular shaped, double per surface, piezoelectric quartz crystal device 100 is shown which is similar to the device shown in FIG. 7C or 7D, but has a rectangular shaped substrate 22G like the rectangular substrate 22X shown in FIG. 5A. The reference numerals in FIG. 8A that corresponds to the reference numerals pf FIG. 1A or 1B are used again to identify similar elements of the device 100, but the letter G is added to the corresponding reference numeral for FIG. 8A (or 8B). Each one of the pair of triangular shaped electrodes 38G located on one side of the device 100 (FIG. 8A) has an overlapping portion in registry with a corresponding triangular shaped electrode 38G located on the other side of the device 100 (FIG. 8B).

The triangular shaped electrode portions with the devices shown in FIGS. 3A, 3B; 3C, 3D; 4A, 4B; 4C, 4D; 5A, 5B; 6A, 6B; 7A, 7B; 7C, 7D; and 8A, 8B have greatly enhanced the performance of these devices by providing a 5 db attenuation of the spurious or inharmonic modes as contrasted with similar device structures using rectangular shaped electrodes (see FIG. 10).

Referring to FIG. 9, Step A depicts a starting substrate 110 which is a piezoelectric quartz crystal substrate member. Preferably, the starting substrate is circular in configuration having a flat edge on opposite portions thereof and is mechanically or chemically reduced in thickness to a generally desirable thickness for a pre-defined frequency. Square or rectangular shaped substrates can also be used, if desired, however the circular shaped substrate is particularly advantageous to use in order to form the pie shaped substrate 22 or 22S of the devices of FIGS. 1A and 2A, respectively.

In Step B, the substrate 110 is made thinner such as by an etching operation using a buffered HF acid. This is done to more precisely control the resultant frequency characteristics of the final device.

Prior to the metal deposition operation shown in Step C, a cleaning operation is carried out using, for example, ultraviolet light in a special environment. Then, a metal layer 112 such as aluminum is deposited (preferably through a mask) on the top and bottom surfaces of the substrate 110 to provide a desired pattern as shown in Step D (Front) and (Back). Alternatively, the metal layer 112 is deposited on the entire top and bottom surface of the substrate 110, as shown in Step C of FIG. 9, and then the desired patterns shown in Step D are etched by conventional photolithographic masking and metal etching techniques. If desired, other metal layers can be used. For example, multiple metal layers can be used, as desired, such as 100 Angstroms of Chromium with a top layer of 1,000 to 10,000 Angstroms of Silver or Gold.

Referring to Step D, the metal pattern 112 formed on the front or top surface of the substrate 110 and the metal pattern formed on the back or bottom surface of the substrate 110 is shown prior to the dicing operation carried out in Step E to fabricate four pie shaped devices from a single starting substrate.

Referring to Step E, a dicing operation (by a scribe and break process or by use of a diamond wheel cut or a slurry saw cut) is carried out to produce four quarter pie shaped members each having a pair of pie shaped electrodes per surface (one of these members is shown in the device of FIG. 1A or 1B). By using one starting (circular) substrate, each of the four quarter pie shaped pieces will have the same temperature and frequency characteristics as the others thereby providing matched components for electronic system applications. Fabrication of the single pie shaped electrode on the pie shaped substrate as shown in FIG. 2A or 2B is done the same way except for the formation of a metal pattern on each side having four pie shaped electrodes to permit the formation of the device of FIG. 2A.

FIG. 10 depicts a graphical view of the electrical response curve of a substantially circular piezoelectric quartz crystal substrate having a pair of rectangular shaped electrodes per surface as shown in phantom on the upper right hand portion of this Figure. The abcissa is the frequency of the device (in K Hz) and the ordinate is the db variation. Thus, the device whose electrical response curve is shown in FIG. 10 is excited by a major harmonic frequency of 1070 K Hz, but has spurious modes, as shown as high as −30 db down from the main harmonic mode.

Figure 11:
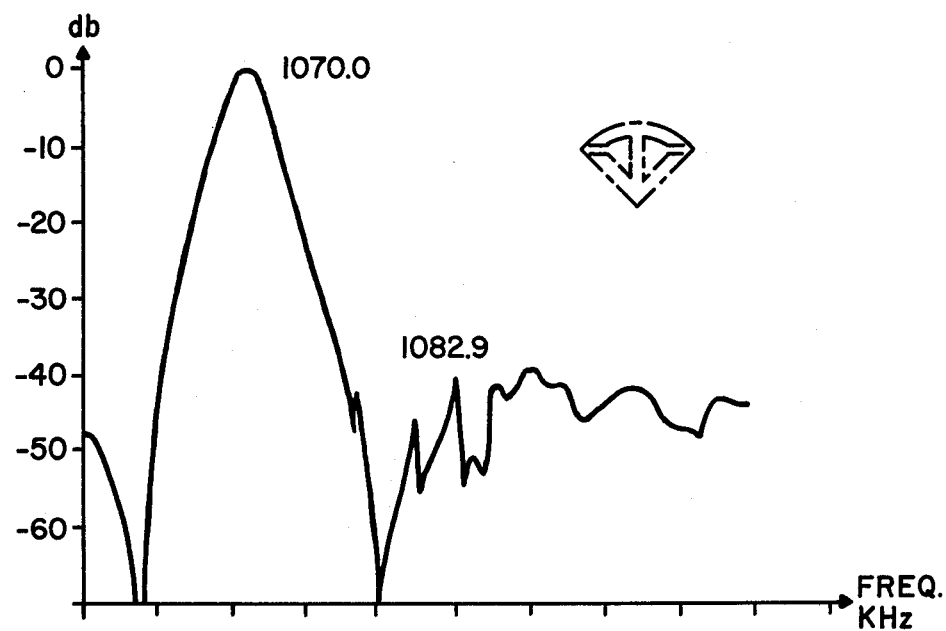
FIG. 11 is a graphical view similar to FIG. 10, however, the device is a pie-shaped piezoelectric substrate having a pair of pie shaped electrodes which provide an attenuation improvement of at least 10db of the spurious modes as compared to the response results using the device for FIG. 10.

FIG. 11 depicts a graphical view, similar to the view of FIG. 10, but of a pie shaped (quarter pie), piezoelectric quartz crystal substrate having a pair of pie shaped electrodes per surface as shown in phantom on the upper right hand portion of this Figure. Again, the abcissa is the frequency of the device (in K Hz) and the ordinate is the db variation. The device of FIG. 11 also is excited by a main harmonic frequency of 1070 K Hz, but has very significantly attenuated the spurious modes to a level −40 db down from the main harmonic mode which is a 10 db improvement over the prior art type device and response shown in FIG. 10.

While the invention has been particularly shown and described with reference to the preferred embodiments thereof, it will be understood to those skilled in the art that the foregoing and other changes in form and details may be made therein without departing from the spirit and scope of the invention. For example, pie shaped electrodes can be utilized on circular, square or rectangular substrates in place of the triangular shaped electrodes shown in the Figures. Additionally, more than the two electrodes per substrate surface can be used, if desired.

What is claimed is:

1. A piezoelectric device comprising, in combination, a pie shaped piezoelectric substrate at least two electrically conductive support members connected to said pie shaped piezoelectric substrate, at least one pie shaped electrode located on each surface of said pie shaped piezoelectric substrate, said one pie shaped electrode on one surface of said pie shaped piezoelectric substrate being electrically connected to one of said two electrically conductive support members, said one pie shaped electrode on the other surface of said pie shaped piezoelectric substrate being electrically connected to the other of said two electrically conductive support members, said one pie shaped electrode located on one surface of said pie shaped piezoelectric substrate overlapping and in registry with said one pie shaped electrode located on the other surface of said pie shaped piezoelectric substrate.

2. A piezoelectric device in accordance with claim 1 wherein said pie shaped piezoelectric substrate comprising a piezoelectric quartz crystal substrate.

3. A piezoelectric device in accordance with claim 1 wherein two pie shaped electrodes are located on each surface of said pie shaped piezoelectric substrate, each one of said two pie shaped electrodes located on one surface of said pie shaped piezoelectric substrate overlapping and in registry with one of said two pie shaped electrodes located on the other surface of said pie shaped piezoelectric substrate.

4. A piezoelectric device in accordance with claim 3 wherein said pie shaped piezoelectric substrate comprising a piezoelectric quartz crystal substrate.

5. A piezoelectric device in accordance with claim 3 wherein three electrically conductive support members are connected to said pie shaped piezoelectric substrate, one of said two pie shaped electrodes located on said one surface of said pie shaped piezoelectric substrate being electrically connected to one of said three electrically conductive support members, both of said two pie shaped electrodes located on the other surface of said pie shaped piezoelectric substrate being electrically connected together and to the third of said three electrically conductive support members.

6. A piezoelectric device in accordance with claim 5 wherein said pie shaped piezoelectric substrate comprising a piezoelectric quartz crystal substrate.

7. A piezoelectric device in accordance with claim 1 wherein said one pie shaped electrode located on each surface of said pie shaped substrate having an outer configuration shaped like the outer configuration of the pie shaped piezoelectric substrate.

8. A piezoelectric device in accordance with claim 3 wherein each one of said two pie shaped electrodes located on each surface of said pie shaped piezoelectric substrate having two outer side portions having a configuration shaped like the respective adjacent outer configuration of the pie shaped piezoelectric substrate, the outer configuration of both said two pie shaped electrodes taken together on each side providing a substantially pie shaped configuration on each side of said pie shaped piezoelectric substrate.

9. A piezoelectric quartz crystal device comprising, in combination, a piezoelectric quartz crystal substrate, at least two electrically conductive support members connected to said piezoelectric quartz crystal substrate, means for improving the attenuation of spurious modes of said device, said means comprising at least one pie shaped electrode located on each surface of said piezoelectric quartz crystal substrate, said one pie shaped electrode on one surface of said piezoelectric quartz crystal substrate being electrically connected to one of said two electrically conductive support members, said one pie shaped electrode on the other surface of said piezoelectric quartz crystal substrate being electrically connected to the other of said two electrically conductive support members, said one pie shaped electrode located on one surface of said piezoelectric quartz crystal substrate overlapping and in registry with said one pie shaped electrode located on the other surface of said piezoelectric quartz crystal substrate.

10. A piezoelectric quartz crystal device in accordance with claim 9 wherein two pie shaped electrodes are located on each surface of said substrate, each one of said two pie shaped electrodes located on one surface of said substrate overlapping and in registry with one of said two pie shaped electrodes located on the other surface substrate.

11. A piezoelectric device in accordance with claim 10 wherein three electrically conductive support members are connected to said substrate, one of said two pie shaped electrodes located on said one surface of said substrate being electrically connected to one of said three electrically conductive support members, the other of said two pie shaped electrodes located on said one surface of said substrate being electrically connected to a second of said three electrically conductive support members, both of said two pie shaped electrodes located on the other surface of said substrate being electrically connected together and to the third of said three electrically conductive support members.

12. A piezoelectric device comprising in combination, a piezoelectric substrate, at least two electrically conductive support members connected to said piezoelectric substrate, means for improving the attenuation of spurious modes of said device, said means comprising at least one triangular shaped electrode located on each surface of said piezoelectric substrate, said one triangular shaped electrode on one surface of said piezoelectric substrate being electrically connected to one of said two electrically conductive support members, said one triangular shaped electrode located on the other surface of said piezoelectric substrate being electrically connected to the other of said two electrically conductive support members, said one triangular shaped electrode located on one surface of said piezoelectric substrate overlapping and in registry with said one triangular shaped electrode located on the other surface of said piezoelectric substrate.

13. A piezoelectric device in accordance with claim 12 wherein said piezoelectric substrate comprising a piezoelectric quartz crystal substrate.

14. A piezoelectric device in accordance with claim 12 wherein said piezoelectric substrate comprising a substantially circular substrate.

15. A piezoelectric device in accordance with claim 12 wherein said piezoelectric substrate comprising a square substrate.

16. A piezoelectric device in accordance with claim 15 wherein said square piezoelectric substrate being connected to said two electrically conductive support members at two corners of said square piezoelectric substrate located on one diagonal thereof.

17. A piezoelectric device in accordance with claim 15 wherein said square piezoelectric substrate being connected to said two electrically conductive support members at two bottom corners of said square piezoelectric substrate.

18. A piezoelectric device in accordance with claim 12 wherein said piezoelectric substrate comprising a rectangular substrate.

19. A piezoelectric device in accordance with claim 18 wherein said rectangular piezoelectric substrate being connected to said two electrically conductive support members at two bottom corners of said rectangular piezoelectric substrates.

20. A piezoelectric device in accordance with claim 12 wherein said means for improving the attenuation of spurious modes of said device comprising two triangular shaped electrodes located on each surface of said substrate, each one of said two triangular shaped electrodes located on one surface of said substrate overlapping and in registry with one of said two triangular shaped electrodes located on the other surface of said substrate.

21. A piezoelectric device in accordance with claim 20 wherein three electrically conductive support members are connected to said substrate, one of said two triangular shaped electrodes located on said one surface of said substrate being electrically connected to one of said three electrically conductive support members, the other of said two pie shaped electrodes located on said one surface of said substrate being electrically connected to a second of said three electrically conductive support members, both of said two triangular shaped electrodes located on the other surface of said substrate being electrically connected together and to the third of said three electrically conductive support members.

22. A piezoelectric device in accordance with claim 21 wherein said substrate comprising a piezoelectric quartz crystal substrate.

23. A piezoelectric device in accordance with claim 21 wherein said substrate comprising a substantially circular substrate.

24. A piezoelectric device in accordance with claim 21 wherein said substrate comprising a square substrate.

25. A piezoelectric device in accordance with claim 24 wherein said square substrate being connected to two of said electrically conductive support members at two corners of said square substrate located on one diagonal thereof.

26. A piezoelectric device in accordance with claim 24 wherein said square substrate being connected to two of said electrically conductive support members substantially intermediate two sides of said square substrate.

27. A piezoelectric device in accordance with claim 21 wherein said substrate comprising a rectangular substrate.

* * * * *

UNITED STATES PATENT AND TRADEMARK OFFICE
CERTIFICATE OF CORRECTION

PATENT NO. : 4,123,680

DATED : October 31, 1978

INVENTOR(S) : Daryl M. Kemper; Louis A. Dick

It is certified that error appears in the above-identified patent and that said Letters Patent are hereby corrected as shown below:

Claim 10, line 53 after the word "surface" and before the word "substrate" insert the words --of said--

Signed and Sealed this

Twentieth Day of February 1979

[SEAL]

Attest:

RUTH C. MASON
Attesting Officer

DONALD W. BANNER
Commissioner of Patents and Trademarks